United States Patent [19]

Dixon, Jr. et al.

[11] Patent Number: 4,864,645

[45] Date of Patent: Sep. 5, 1989

[54] HARMONICALLY PUMPED MONOLITHIC PLANAR DOPED BARRIER MIXER

[75] Inventors: Samuel Dixon, Jr., Neptune; Thomas R. AuCoin; Raymond L. Ross, both of Ocean, all of N.J.

[73] Assignee: The United States of America as represented by the Secretary of the Army, Washington, D.C.

[21] Appl. No.: 199,819

[22] Filed: May 26, 1988

[51] Int. Cl.$^4$ ............................................. H04B 1/26
[52] U.S. Cl. ................................. 455/327; 333/247; 455/330
[58] Field of Search ............... 333/247, 250; 455/327, 455/328, 330

[56] References Cited

U.S. PATENT DOCUMENTS

| | | | |
|---|---|---|---|
| 4,320,536 | 3/1982 | Dietrich | 455/325 |
| 4,410,902 | 10/1983 | Malik | 357/13 |
| 4,412,354 | 10/1983 | Hu | 455/328 X |
| 4,485,488 | 11/1984 | Houdart | 455/327 |
| 4,563,773 | 1/1986 | Dixon, Jr. et al. | 455/327 |
| 4,654,609 | 3/1987 | Dixon, Jr. et al. | 333/17 L |
| 4,742,571 | 5/1988 | Letron | 333/247 X |

OTHER PUBLICATIONS

"Subharmonic Mixer Using Planar Doped Barrier Diodes", S. Dixon, R. J. Malik, J. Paul, P. Yen, T. R. AuCoin, L. T. Yaun, pp. 27–29, 1982 IEEE MTT-S Digest.

Primary Examiner—Paul Gensler
Attorney, Agent, or Firm—Michael J. Zelenka; Ann M. Knab

[57] ABSTRACT

A microwave mixer suitable for millimeter wave radar applications. A semi-insulating gallium arsenide dielectric waveguide structure contains an embedded planar doped barrier (PDB) structure as a non-linear mixing element. The local oscillator (LO) signal is guided to the PDB structure via a coplanar type waveguide. The radio frequency (RF) signal is guided to the PDB structure via an image guide and a microstrip circuit serves to transmit the intermediate frequency (IF).

5 Claims, 2 Drawing Sheets

HARMONICALLY PUMPED MONOLITHIC PLANAR DOPED BARRIER MIXER

The invention described herein may be manufactured, used, and licensed by of for the Government for governmental purposes without the payment of any royalties thereof or therefor.

FIELD OF THE INVENTION

This invention relates generally to signal mixers and more particularly to monolithic structures employing planar doped barrier mixing diodes.

BACKGROUND OF THE INVENTION

A mixer is an apparatus which converts an incoming signal from one frequency to another by combining it with a local oscillator signal in a non-linear device such as a diode. Mixers are often used in radar systems to convert an incoming radio frequency (RF) (from a target) to a lower intermediate frequency (IF) before further processing. In general, mixing produces a large number of sum and difference frequencies. Usually the difference frequency between the signal (RF frequency) and local oscillator (LO frequency) is of interest.

Usually the LO frequency is close to the RF frequency. A subharmonic mixer utilizes an LO frequency which is approximately one-half of the RF frequency. At very high millimeter-wave frequencies where pump power is at a premium, subharmonic local oscillator pumping has numerous advantages. The devices are much easier to fabricate and the pumping power level needed is much easier to generate.

One example of a subharmonic mixer utilizing a planar doped barrier (PDB) diode is contained in U.S. Pat. No. 4,563,773, issued to Dixon, Jr. et al. A PDB diode is an effective mixing device.

The construction and operation of a planar doped barrier semiconductor device is discussed in U.S. Pat. No. 4,410,902, issued to Malik, the disclosure of which is incorporated herein by reference.

Those concerned with the development of radars into the millimeter wave region realize that pumping power (i.e., LO power) is at a premium. Subharmonic pumping at needed power levels is accomplished more simply and cheaply. There is, therefore, a continuing need for low cost mixers operating at subharmonic and lower sub-multiple frequencies with designs amenable to mass production.

SUMMARY OF THE INVENTION

Accordingly, it is an object of the present invention to provide a device for mixing an input signal with a local oscillator signal to provide an intermediate frequency output signal.

It is another object of the present invention to provide a signal mixer which operates in the millimeter wave frequency band.

Still another object of the present invention is to provide a signal mixer fabricated as a monolithic integrated circuit structure.

A further object of the present invention is to provide a subharmonic mixer utilizing a planar doped barrier structure.

Briefly these and other objects are accomplished with a semi-insulating gallium arsenide dielectric waveguide structure. A planar doped barrier diode is embedded within the semi-insulating gallium arsenide. The PDB structure provides mixing for the RF and LO frequencies. The LO frequency is introduced via a coplanar structure. The IF frequency is extracted via a microstrip structure. One portion of the gallium arsenide dielectric may be inserted into a metal rectangular waveguide, thus providing an image guide structure. The RF is introduced via the image guide structure.

BRIEF DESCRIPTION OF THE DRAWINGS

Further objects and advantages of the present invention will become apparent to those familiar with the art upon examination of the following detailed description and accompanying drawings in which.

DETAILED DESCRIPTION

Figure 1:
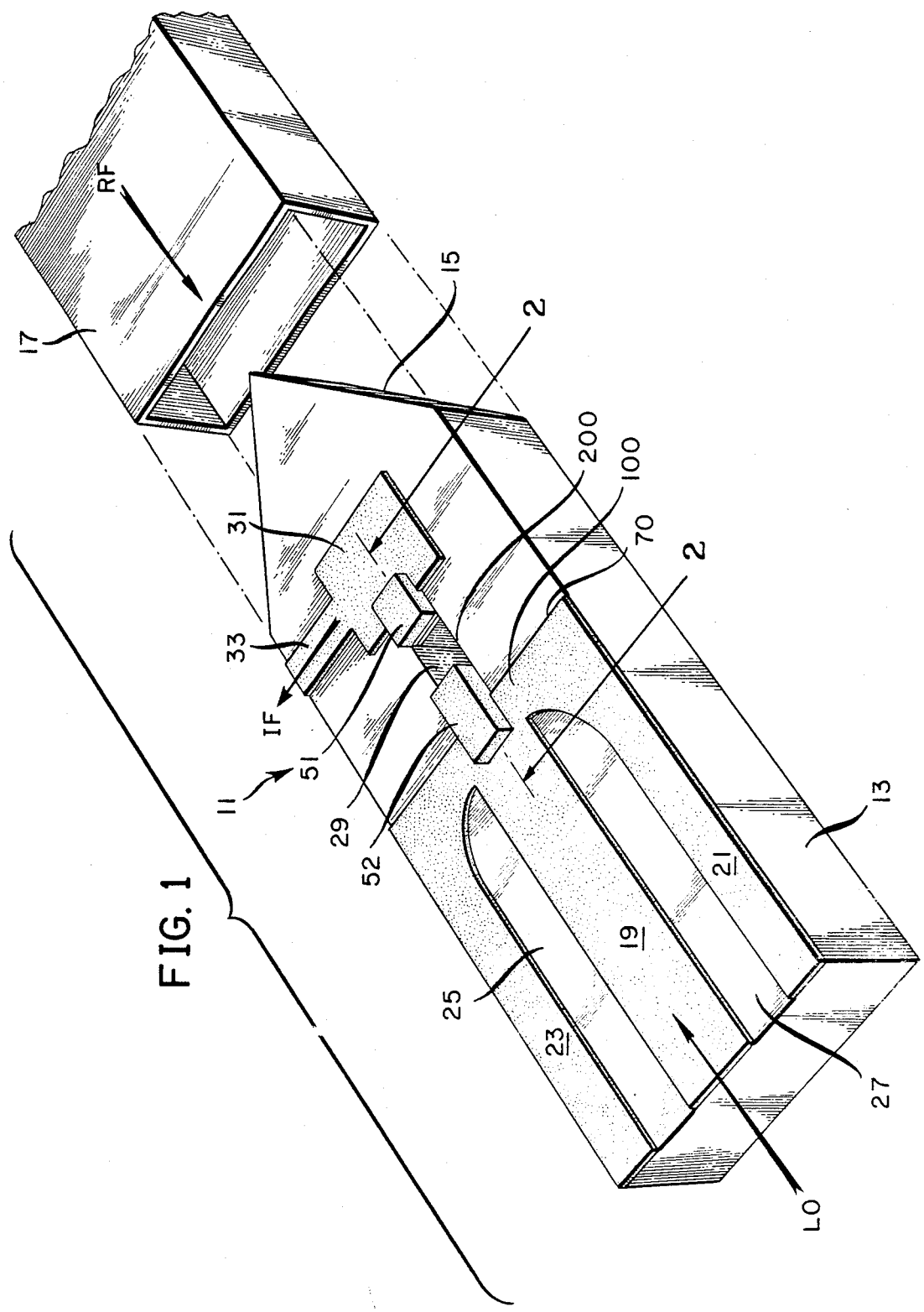
FIG. 1 is a perspective view of the inventive device.

Referring to FIG. 1, the inventive device is shown generally by reference numeral 11. Substrate 13 is made from semi-insulating gallium arsenide. Semi-insulating gallium arsenide is doped with chromium which tends to pin the Fermi level near the center of the energy band gap, thus producing a material with a high resistivity and high dielectric constant. One end 15 of substrate 13 is tapered to form a transition section. The geometry of tapered section 15 (i.e. the angle of taper) is governed principally by impedance matching considerations well known to those skilled in the art. Tapered section 15 may be fitted into a metallic rectangular waveguide 17. The resulting structure is effectively an image guide structure suitable for the introduction of the RF signal to the mixer.

A coplanar structure consisting of three parallel metallized strips, 19, 21, and 23 is formed at the opposite end of gallium arsenide substrate 13. Strips 19, 21, and 23 are made from metal, preferably gold. Gaps 25 and 27 between strip pairs 19-23 and 19-21 respectively serve to expose portions of gallium arsenide substrate 13. The coplanar structure just described serves to guide the LO signal toward planar doped barrier diode 29 which will be described in further detail below. The central metallic strip 19 has generally rectangular dimensions. Strips 23 and 21 become wider within approximately one wavelength of PDB diode 29. All three strips 19, 21 and 23 are joined at common region 100. Edge 70 of region 100 is overlapped by beam lead 52 of PDB diode 29. Design rules well known to those skilled in the art indicate the dimensions of strips 19, 21 and 23 and common region 100.

Rectangular microstrip structure 31 is sized according to well known design rules to transmit the resulting intermediate frequency via transmission segment 33 which extends to the side edge of gallium arsenide substrate 13.

The coplanar structure created by strips 19, 21, and 23 is well suited to the transmission of subharmonic and lower frequencies, while the image guide and microstrip structures are well suited to the transmission of the RF and IF frequencies respectively.

An explanation of typical mixing in the inventive device follows. Typically the incident RF frequency may be near 60 GHz. The local oscillator is selected to operate at approximately the fourth sub-multiple of the RF frequency. A suitable LO frequency might be 14.9 GHz. The mixer combines the fourth harmonic of the local oscillator frequency (approximately 59.6 GHz) with the RF frequency, to generate a resulting IF of approximately 400 MHz. Transmission segment 33 is sized to permit most efficient transmission of the desired IF frequency (i.e., 400 MHz).

Figure 2:
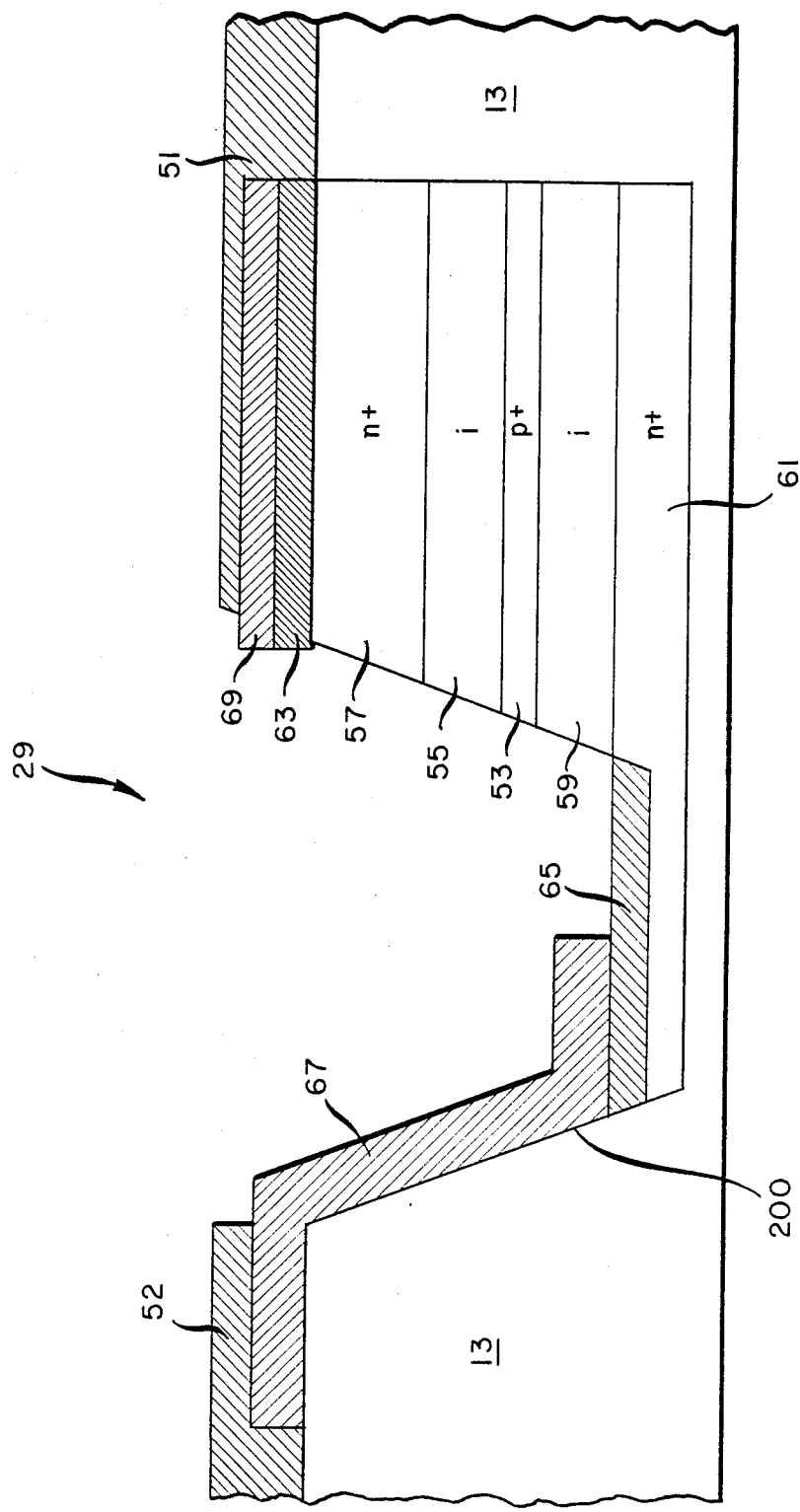
FIG. 2 is cross sectional view of a portion of FIG. 1 showing the details of the planar doped barrier diode construction.

Turning now to FIG. 2 there is disclosed in detail the structure of the planar doped barrier diode device 29. PDB structure 29 is located within well 200 which extends into substrate 13. The PDB structure 29 has an $n^+ip^+in^+$ configuration in which, for this application, an extremely narrow $p+$ region 53 is positioned halfway between two regions of nominally undoped semiconductor 55 and 59 bounded by two heavily doped $n+$ regions 57 and 61.

The PDB structure 29, which resembles two back-to-back diodes provides effective mixing of the RF and LO signals, providing (among other frequencies) the desired IF which may be extracted as previously described. The PDB technology provides independent and continuous control of the energy barrier height and the asymmetry of the I-V characteristics by variation of the acceptor charge density and the undoped region widths. Ohmic contacts 63 and 65 are made from alloyed gold-germanium-nickel. Overlay metallizations 67 and 69 are made from chromium-gold. Finally, gold beam lead 52 contacts overlay 67, while gold beam lead 51 contacts overlay 69.

The illustrative embodiment herein is merely one of those possible variations which will occur to those skilled in the art while using the inventive principles contained herein. Accordingly, numerous variations of invention are possible while staying within the spirit and scope of the invention as defined in the following claims and their legal equivalents.

What is claimed is:

1. A device comprising:
    a dielectric substrate having a top surface and first and second ends, said second end being pointed;
    a planar doped barrier diode embedded between said first and second ends of said dielectric substrate, said planar doped barrier diode comprising an epilayered semiconductor structure;
    first, second and third metal strips positioned on said top surface of said substrate and extending from said first end to said epilayered semiconductor structure, said second metal strip having a constant width and said first and third strips having a width which increases toward said epilayered semiconductor structure;
    a fourth metal strip located upon said top surface between said epilayered semiconductor structure and said second end of said substrate,
    and a hollow metallic waveguide for receiving said second end of said substrate, so that an incident RF signal propagating through said waveguide is transmitted through said substrate to said epilayered structure and an LO frequency incident upon said first end of said substrate is also transmitted to said epilayered structure where it is mixed with said RF signal to produce an IF signal at said fourth metal strip.

2. The device of claim 1 wherein said dielectric substrate is gallium arsenide.

3. The device of claim 2 wherein said epilayered semiconductor structure has an $n^+ip^+in^+$ configuration.

4. The device of claim 3 wherein said fourth metal strip is rectangular in shape.

5. A mixer comprising:
    a gallium arsenide substrate having a top surface and first and second ends, said second end being pointed;
    a $n^+i\ p^+i\ n^+$ epilayered semiconductor structure within said substrate and between said first and second ends;
    first, second and third metal strips positioned on said top surface of said substrate and extending from said first end to said $n^+i\ p^+i\ n^+$ structure, said second metal strip having a constant width and said first and third strips having a width which increases toward said n i p i n structure;
    fourth metal strip located upon said top surface between said $n^+i\ p^+i\ n^+$ structure and said second end of said substrate, said fourth metal strip being rectangular;
    a metallic waveguide having a hole for receiving said second end of said substrate, so that an incident RF signal propagating through said waveguide is transmitted through said substrate to said $n^+i\ p^+i\ n^+$ structure and an LO frequency incident upon said first end of said substrate is also transmitted to said $n^+i\ p^+i\ n^+$ structure where it is mixed with said RF signal to produce an IF signal.

* * * * *